(12) United States Patent
Ooi et al.

(10) Patent No.: US 9,974,195 B2
(45) Date of Patent: May 15, 2018

(54) ELECTRICAL JUNCTION BOX

(71) Applicants: AutoNetworks Technologies, Ltd., Yokkaichi-shi, Mie (JP); Sumitomo Wiring Systems, Ltd., Yokkaichi-shi, Mie (JP); Sumitomo Electric Industries, Ltd., Chuo-ku, Osaka-shi, Osaka (JP)

(72) Inventors: Tomohiro Ooi, Yokkaichi (JP); Shigeki Yamane, Yokkaichi (JP); Takehito Kobayashi, Yokkaichi (JP); Yukinori Kita, Yokkaichi (JP); Yoshikazu Sasaki, Yokkaichi (JP)

(73) Assignees: AutoNetworks Technologies, Ltd., Yokkaichi, Mie (JP); Summitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days. days.

(21) Appl. No.: 15/309,996

(22) PCT Filed: Apr. 21, 2015

(86) PCT No.: PCT/JP2015/062084
§ 371 (c)(1),
(2) Date: Nov. 9, 2016

(87) PCT Pub. No.: WO2015/170582
PCT Pub. Date: Nov. 12, 2015

(65) Prior Publication Data
US 2017/0156221 A1    Jun. 1, 2017

(30) Foreign Application Priority Data
May 9, 2014    (JP) ................. 2014-097608

(51) Int. Cl.
*H05K 5/00*    (2006.01)

(52) U.S. Cl.
CPC ................. *H05K 5/0026* (2013.01)

(58) Field of Classification Search
CPC .......... H05K 5/0026; H05K 7/06; H05K 7/14; H02G 3/16
(Continued)

(56) References Cited

U.S. PATENT DOCUMENTS 6,341,063 B2 * 1/2002 Kinoshita ............ H05K 5/0039
361/690
7,283,366 B2 * 10/2007 Yamashita .......... B60R 16/0238
165/80.1
(Continued)

FOREIGN PATENT DOCUMENTS

| JP | 2005151624 A | 6/2005 |
|----|--------------|--------|
| JP | 2005268648 A | 9/2005 |
| JP | 2011172413 A | 9/2011 |

OTHER PUBLICATIONS

International Search Report dated Jul. 21, 2015 pertaining to International Application No. PCT/JP2015/062084.

*Primary Examiner* — Hung S Bui
(74) *Attorney, Agent, or Firm* — Dinsmore & Shohl LLP

(57) ABSTRACT

An electrical junction box includes a circuit assembly including a circuit board and a conductive plate, a engaging component (terminal block), a frame including an installation portion to which the engaging component is installed. A first engaging portion (first bus bar) is formed on one end side of the circuit assembly, and a second engaging portion (second bus bar) is formed on another end side of the circuit assembly. The frame includes a first engaged portion (receiving portion) that is engaged with the first engaging portion and receives the one end side of the circuit assembly. The engaging component includes a second engaged portion (Continued)

(auxiliary receiving portion) that is engaged with the second engaging portion and receives the other end side of the circuit assembly.

6 Claims, 16 Drawing Sheets

(58) Field of Classification Search
USPC ........ 361/759, 728–730, 752, 807, 809, 810
See application file for complete search history.

(56) References Cited

U.S. PATENT DOCUMENTS

| | | | | |
|---|---|---|---|---|
| 7,408,765 B2* | 8/2008 | Kanou | ............ | H05K 7/026 |
| | | | | 361/622 |
| 7,542,294 B2* | 6/2009 | Caines | ............ | H05K 5/061 |
| | | | | 361/704 |

* cited by examiner

ELECTRICAL JUNCTION BOX

CROSS-REFERENCE TO RELATED APPLICATIONS

This application is the U.S. national phase of PCT/JP2015/062084 filed Apr. 21, 2015, which claims priority of Japanese Patent Application No. JP2014-097608 filed May 9, 2014.

FIELD OF THE INVENTION

Techniques disclosed in this specification relate to electrical junction boxes.

BACKGROUND OF THE INVENTION

Heretofore, as a means of distributing electric power to electronic units from a common on-vehicle power supply, electrical junction boxes are commonly known in which a power distribution circuit is constituted by a plurality of bus bars and a switch element and the like are incorporated into the power distribution circuit. An electrical junction box described in JP 2005-151624A (hereinafter referred to as Patent Document 1), for example, is known as this type of electrical junction box. A circuit assembly of this electrical junction box is configured so as to include a circuit unit, a heat radiation member having an adhesion surface to which the circuit unit is adhered, a case that houses the circuit unit, and a cover that is installed in an opening portion of the case.

If an electronic component is mounted on the circuit unit before the circuit unit is adhered to the heat radiation member, the circuit unit is likely to be deformed due to the thin plate shape thereof and the mount portion of the electronic component may be damaged by this deformation, and therefore care needs to be taken in handling the circuit unit in a period from when the electronic component is mounted until the circuit unit is adhered to the heat radiation member. In this regard, the electronic component can be mounted to a circuit unit that has already been adhered to the heat radiation member in the above circuit assembly, so that the circuit unit can be handled without needing such care as described above in a period from when the circuit unit is configured until the circuit unit is attached to the heat radiation member.

However, because the aforementioned circuit assembly is assumed to be attached to a heat radiation member, the problem cannot be resolved in a circuit assembly that does not include a heat radiation member. Also, because the circuit unit needs to be attached to a heat radiation member before an electronic component is mounted, the manufacturing method is restricted.

SUMMARY

An electrical junction box that is disclosed in this specification includes: a circuit assembly including a circuit board and a conductive plate; a engaging component: and a frame including an installation portion to which the engaging component is installed. A first engaging portion is formed on one end side of the circuit assembly, and a second engaging portion is formed on another end side of the circuit assembly. The frame includes a first engaged portion that is engaged with the first engaging portion and receives the one end side of the circuit assembly. The engaging component includes a second engaged portion that is engaged with the second engaging portion and receives the other end side of the circuit assembly.

With this configuration, the circuit assembly can be held by the frame, which is an essential constituent component of the electrical junction box, and therefore the deformation of the circuit board can be suppressed even in a case where the circuit board is likely to be deformed because of the thin plate shape thereof, and handling of the circuit board can be facilitated. Also, when an electronic component is mounted on the circuit board, the frame can be used as a jig for holding the circuit assembly, and therefore a separate jig for holding the circuit assembly is not necessary.

The electrical junction box that is disclosed in this specification may have the following configuration.

The first engaging portion and the second engaging portion may be bus bars formed in the conductive plate.

With this configuration, the first engaging portion and the second engaging portion can be formed using the bus bars.

The engaging component may be a terminal block that includes a housing made of resin and a nut embedded in the housing.

With this configuration, the other end side of the circuit assembly can be received using the terminal block.

The second engaged portion may be a seat surface of the nut that receives the second engaging portion.

With this configuration, the seat surface of the nut to which the second engaging portion configured by the bus bar is bolted can be the second engaged portion.

According to the electrical junction box disclosed in this specification, the circuit assembly can be held by the frame, which is an essential constituent component of the electrical junction box, and handling of the circuit board can be facilitated.

DETAILED DESCRIPTION

Embodiment

Figure 1:
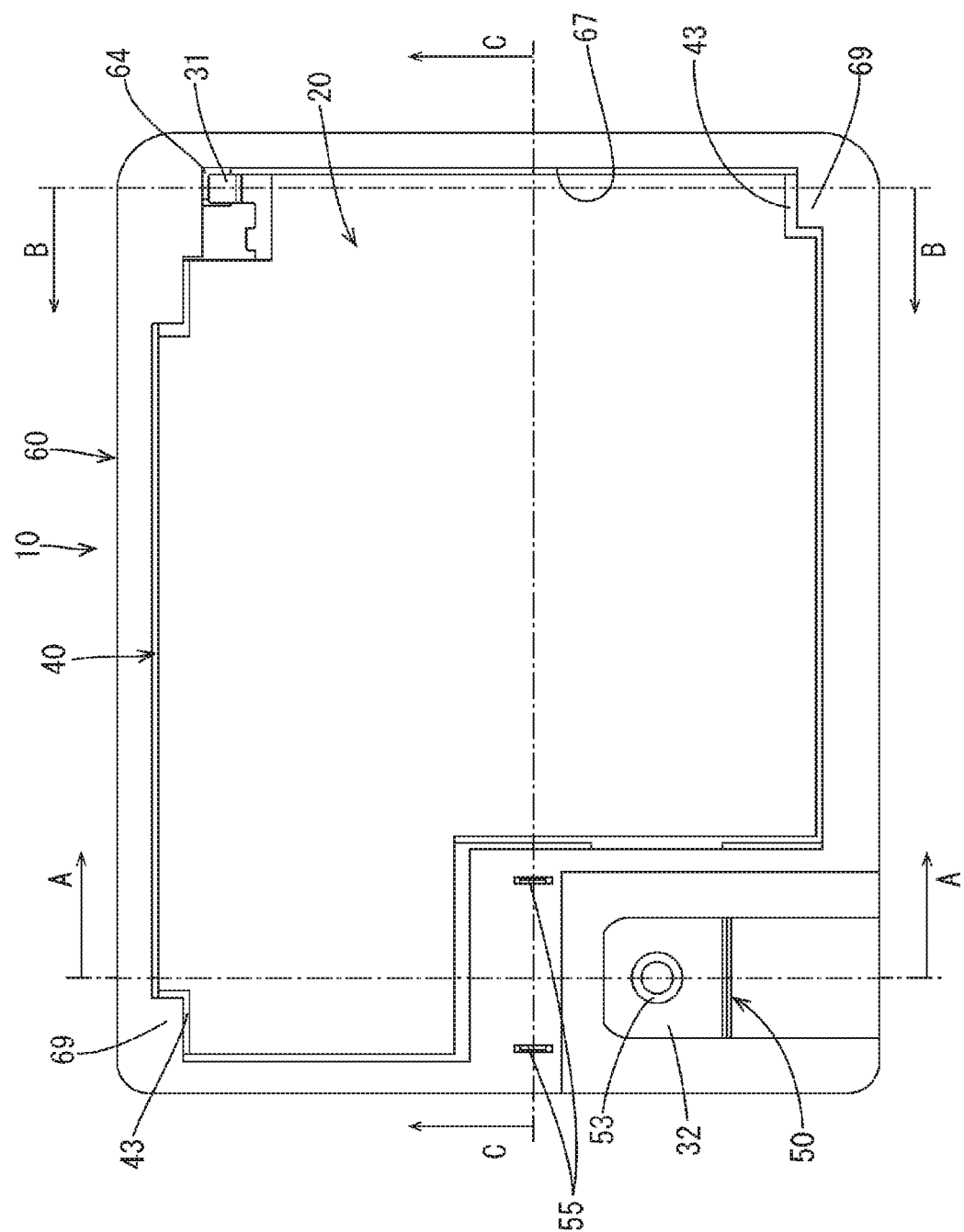
FIG. 1 is a plan view of an electrical junction box.

An embodiment will be described with reference to FIGS. 1 to 16. An electrical junction box 10 of the present embodiment is configured so as to include a circuit assembly 40 including a circuit board 20 and a conductive plate 30, a terminal block 50, and a frame 60. The circuit board 20 and the conductive plate 30 are formed in a flat plate shape, and have approximately the same shape. The circuit assembly 40 is configured by adhering the circuit board 20 and the conductive plate 30 to each other, as shown in FIGS. 8 to 11, and has an approximately flat plate shape in side view, and has an approximately rectangular shape in plan view.

Figure 8:
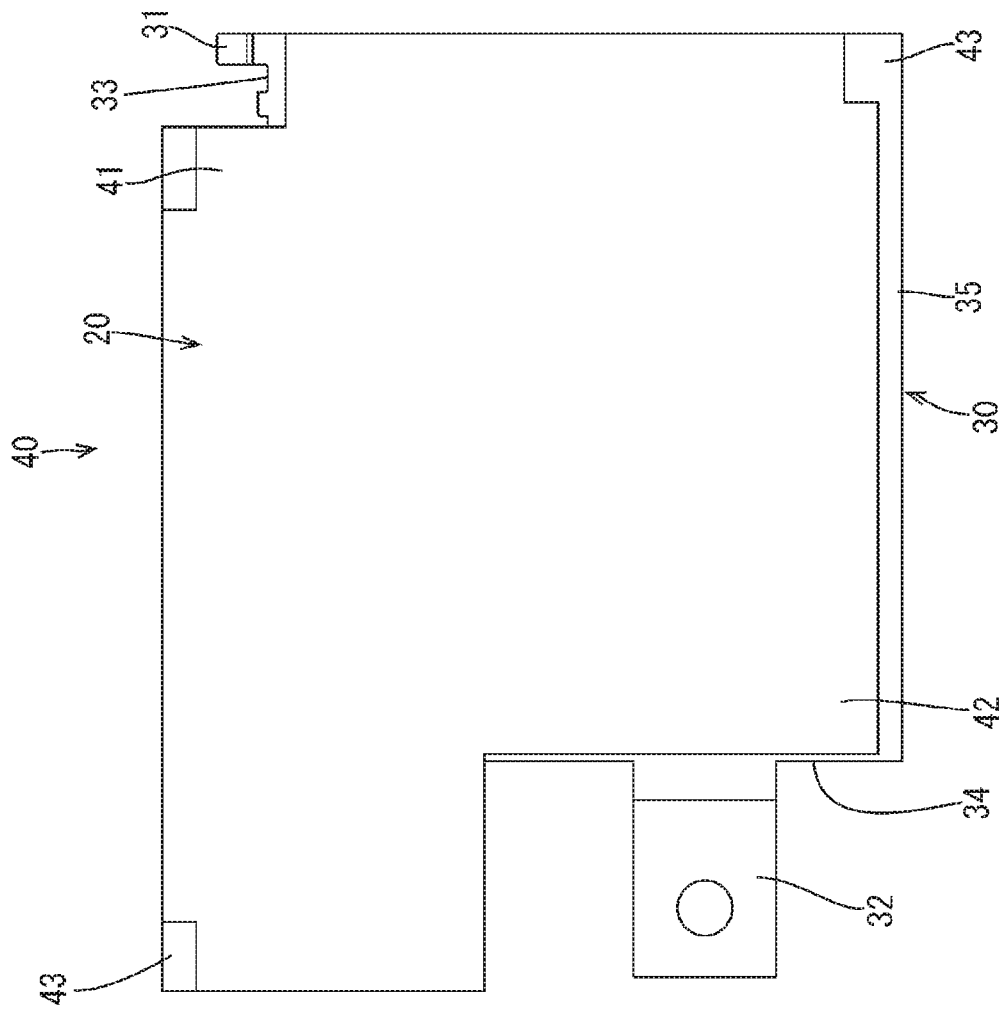
FIG. 8 is a plan view of a circuit assembly.
Figure 9:
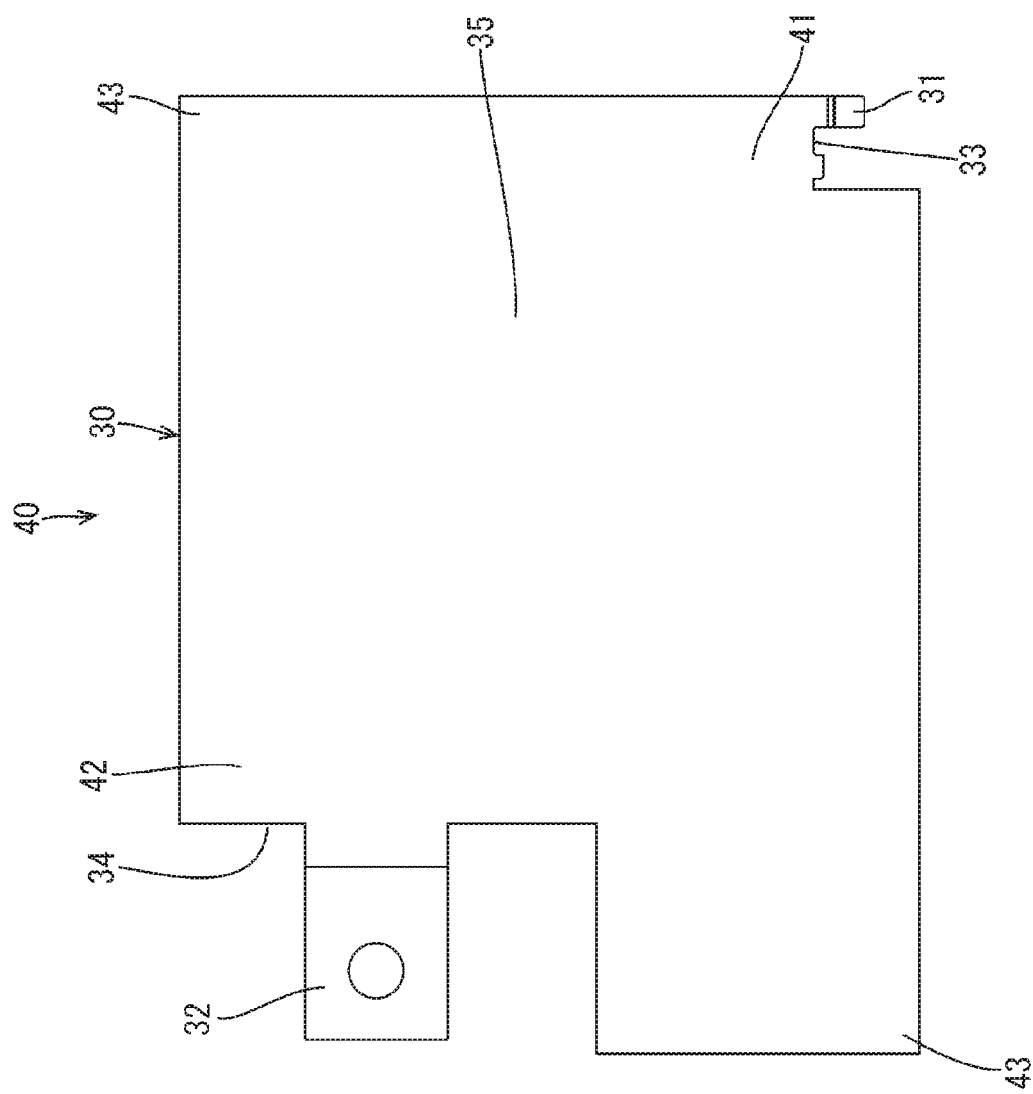
FIG. 9 is a bottom view of the circuit assembly.
Figure 10:
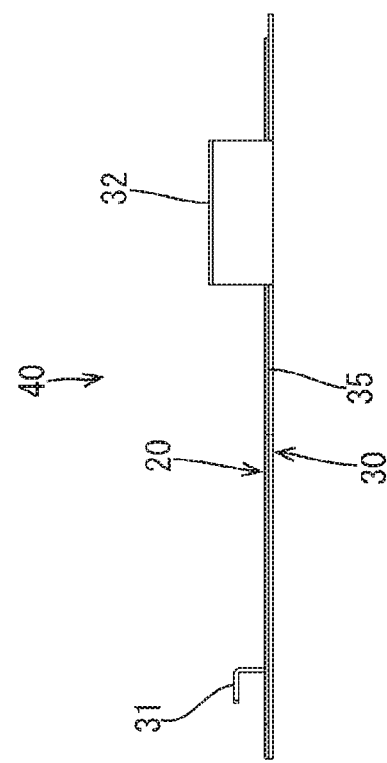
FIG. 10 is a side view of the circuit assembly.
Figure 11:
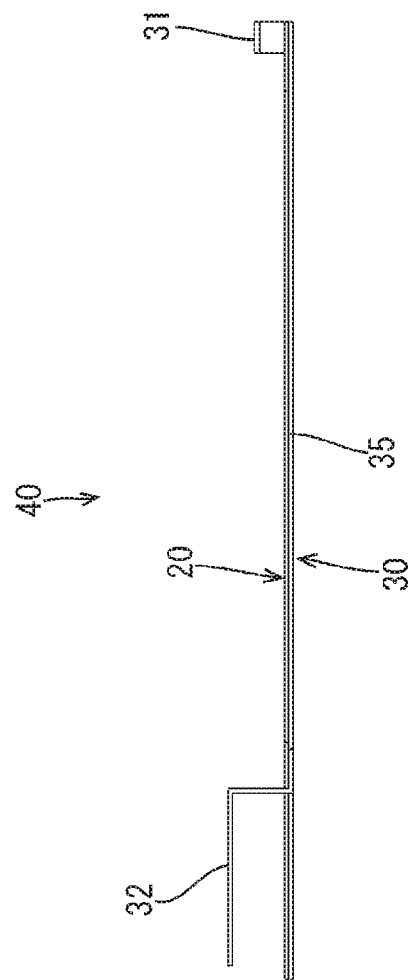
FIG. 11 is a front view of the circuit assembly.

Semiconductor switching elements, which are not shown, are mounted on the circuit board 20, and a control circuit for controlling the drive of the semiconductor switching elements is formed in the circuit board 20. The conductive plate 30 is configured so as to include a first bus bar 31 arranged on one end side 41 of the circuit assembly 40, a second bus bar 32 arranged on another end side 42 of the circuit assembly 40, and the like, as shown in FIG. 8. As shown in FIG. 1, the first bus bar 31 is a portion that is attached to the frame 60, and the second bus bar 32 is a power supply terminal to be connected to a round terminal on a power supply side.

The first bus bar 31 is provided in a range of a first cutout portion 33 that is formed by a cutout on the one end side 41 of the circuit assembly 40 in plan view, as shown in FIG. 8. Also, the first bus bar 31 extends upwardly from an edge of the first cutout portion 33 and thereafter in a horizontal direction from an extended end thereof, and as a result the first bus bar 31 has a stepped shape. Likewise, the second bus bar 32 extends upwardly from an edge of a second cutout portion 34 and thereafter in the horizontal direction of an extended end thereof, the second cutout portion 34 being formed by a cutout on the other end side 42 of the circuit assembly 40 in plan view, and as a result the second bus bar 32 has a stepped shape. The first bus bar 31 and the second bus bar 32 are arranged so as to be orthogonal to each other in plan view.

Figure 5:
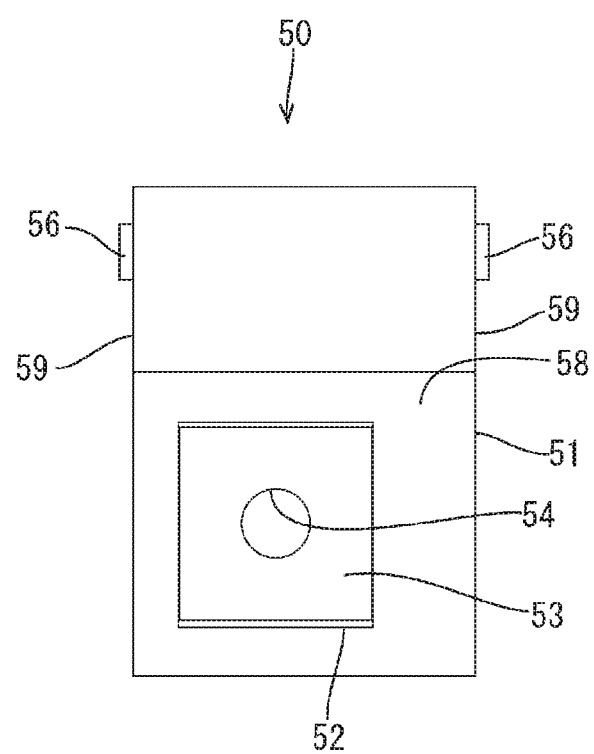
FIG. 5 is a plan view of a terminal block.
Figure 6:
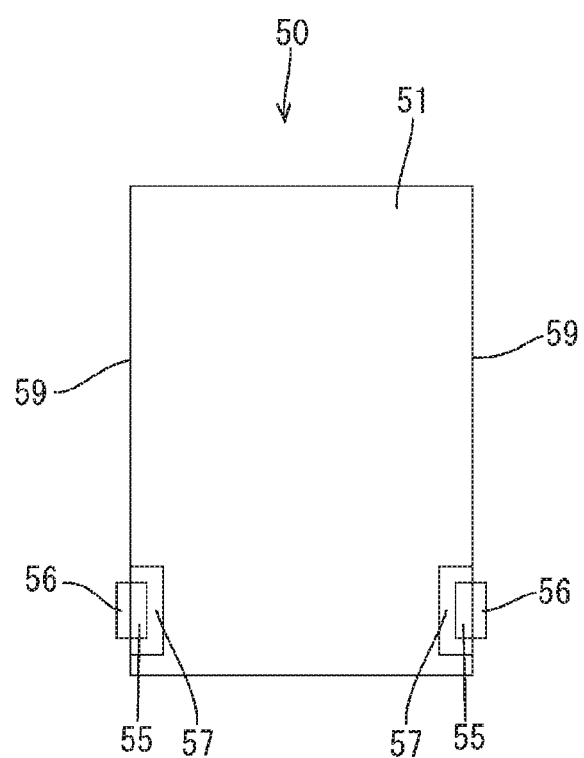
FIG. 6 is a bottom view of the terminal block.
Figure 7:
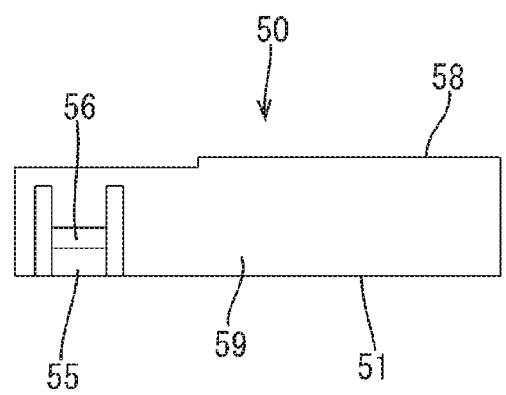
FIG. 7 is a side view of the terminal block.

The terminal block 50 has an approximately rectangular block shape as a whole, as shown in FIGS. 5 to 7, and is configured so as to include a housing 51 made of resin and a nut 52 embedded in the housing 51. The nut 52 has a square shape in plan view, and is fixed to the housing 51 by press fitting or insert molding. A fastening seat surface 53 of the nut 52 is exposed at an upper surface 58 of the housing 51. A screw hole 54 is provided in the fastening seat surface 53.

A pair of engaging pieces 55 on the left and the right are formed on two side surfaces 59 on the left and the right of the housing 51. Each of the engaging pieces 55 is an elastic piece, anchored at only one end and including a bending space 57 on an inner side of the housing 51, as shown in FIG. 6. Also, the engaging pieces 55 respectively include engaging protrusions 56 that protrude from the two side surfaces 59 on the left and the right of the housing 51. Therefore, when the engaging protrusions 56 are pressed inward, the engaging pieces 55 are elastically bent and deformed, and are respectively housed inside the bending spaces 57.

Figure 12:
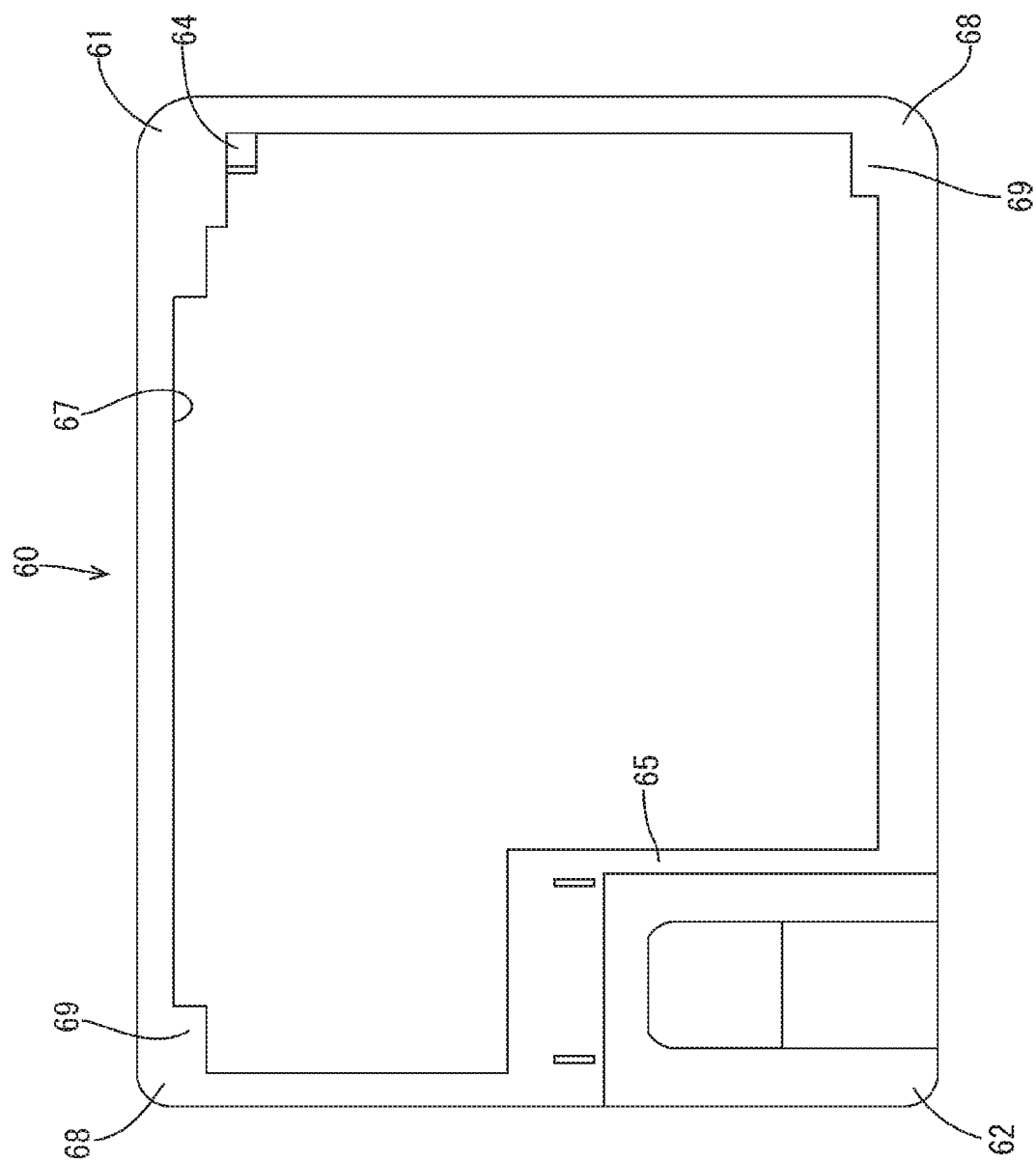
FIG. 12 is a plan view of a frame.
Figure 13:
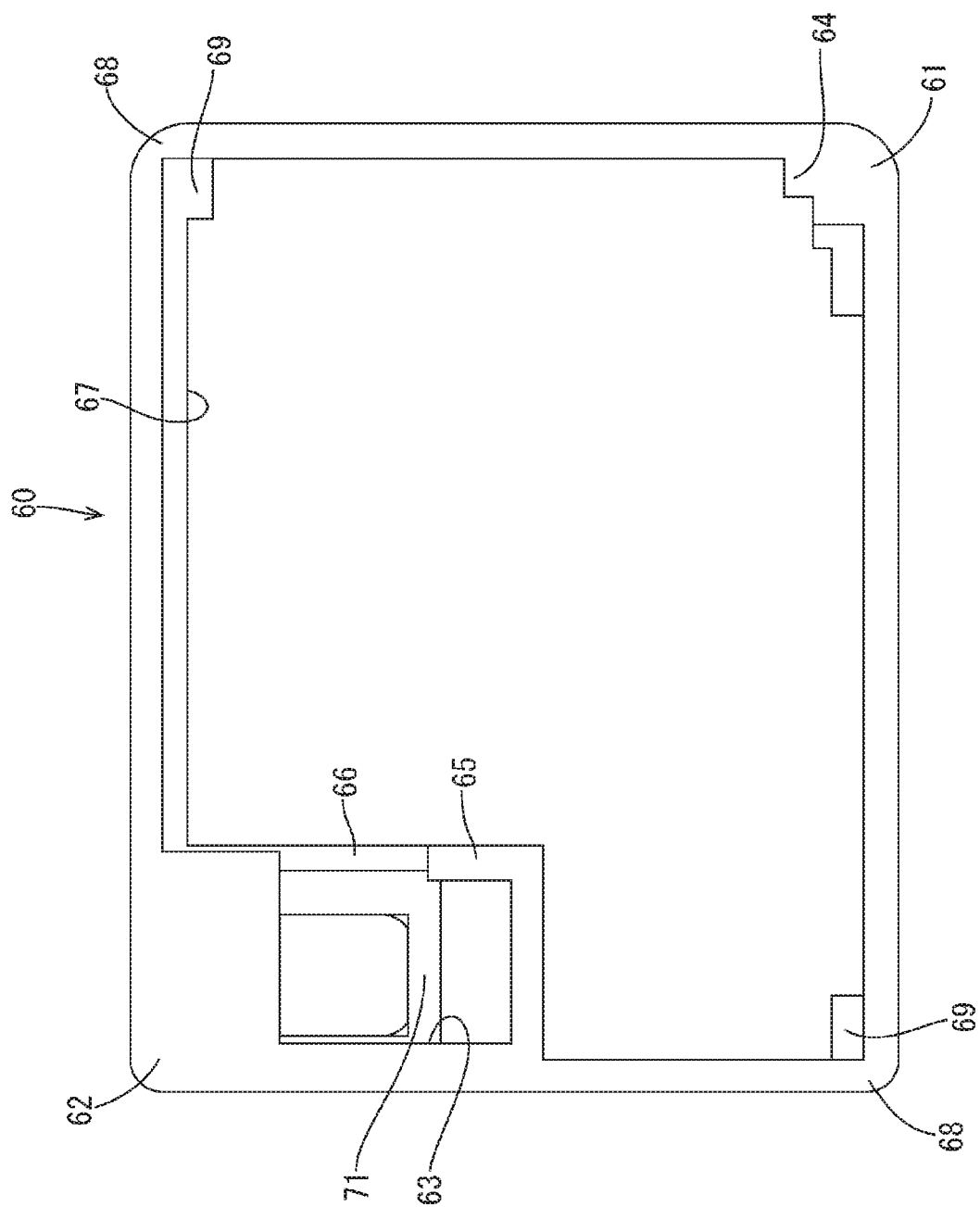
FIG. 13 is a bottom view of the frame.

The frame 60 has an approximately rectangular frame shape in plan view, as shown in FIGS. 12 and 13. The frame 60 is made of synthetic resin, and includes an installation portion 63 to which the terminal block 50 is installed and a housing portion 67 that mainly houses a body portion 35 having a flat plate shape that is a portion of the conductive plate 30 other than the first bus bar 31 and the second bus bar 32.

Figure 14:
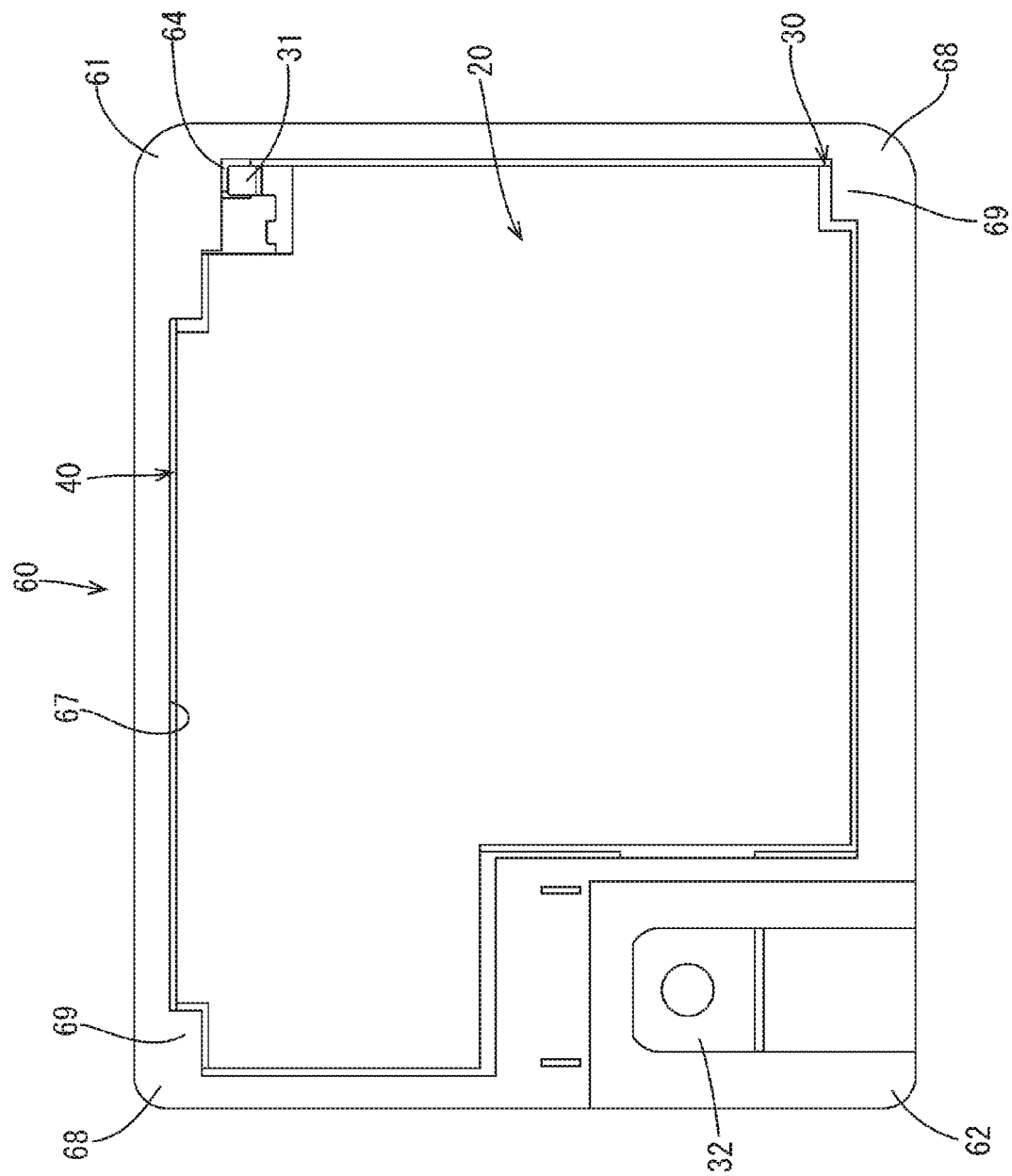
FIG. 14 is a plan view illustrating a state in which the circuit assembly is installed to the frame.

The installation portion 63 is provided on one end side 61 of the frame 60. On the other hand, a receiving portion 64 is formed on the other end side 62 diagonal to the one end side 61 of the frame 60. The receiving portion 64 is configured such that the first bus bar 31 of the circuit assembly 40 is hooked from above and received, as shown in FIG. 14. Accordingly, the one end side 41 of the circuit assembly 40 is supported by the one end side 61 of the frame 60.

Figure 2:
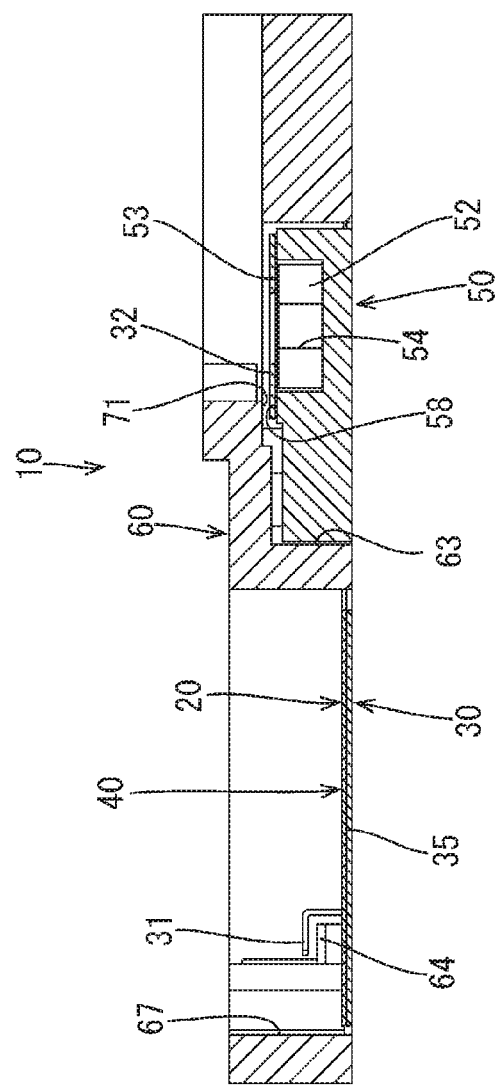
FIG. 2 is a cross-sectional view taken along line A-A in FIG. 1.
Figure 3:
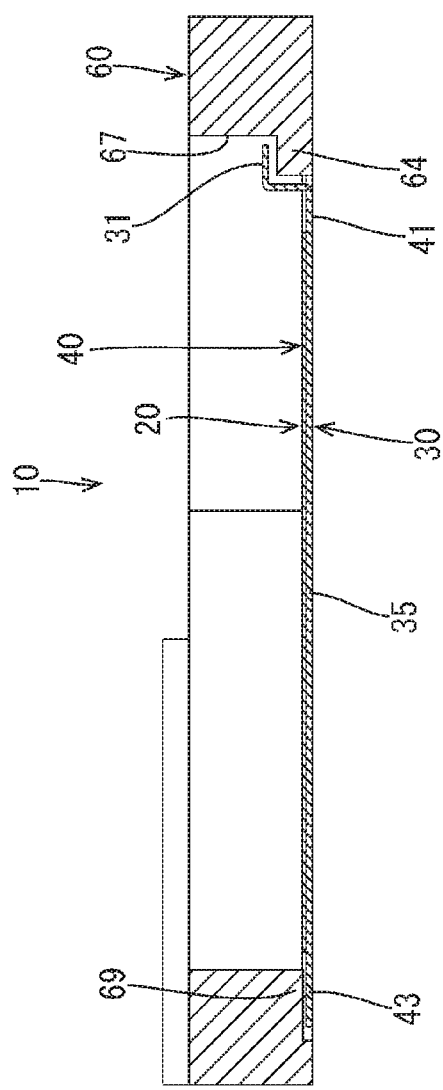
FIG. 3 is a cross-sectional view taken along line B-B in FIG. 1.
Figure 15:
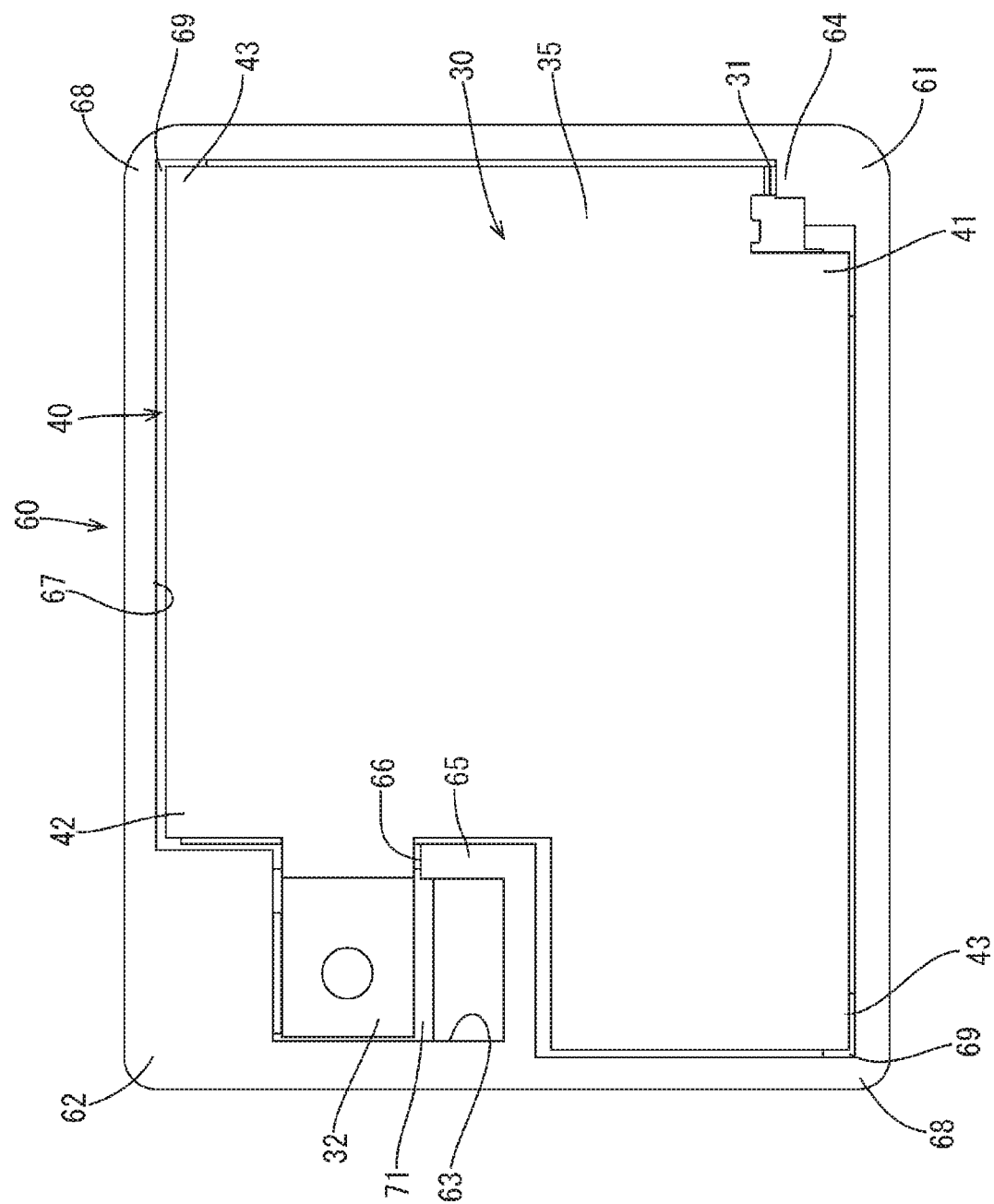
FIG. 15 is a bottom view illustrating the state in which the circuit assembly is installed to the frame.
Figure 16:
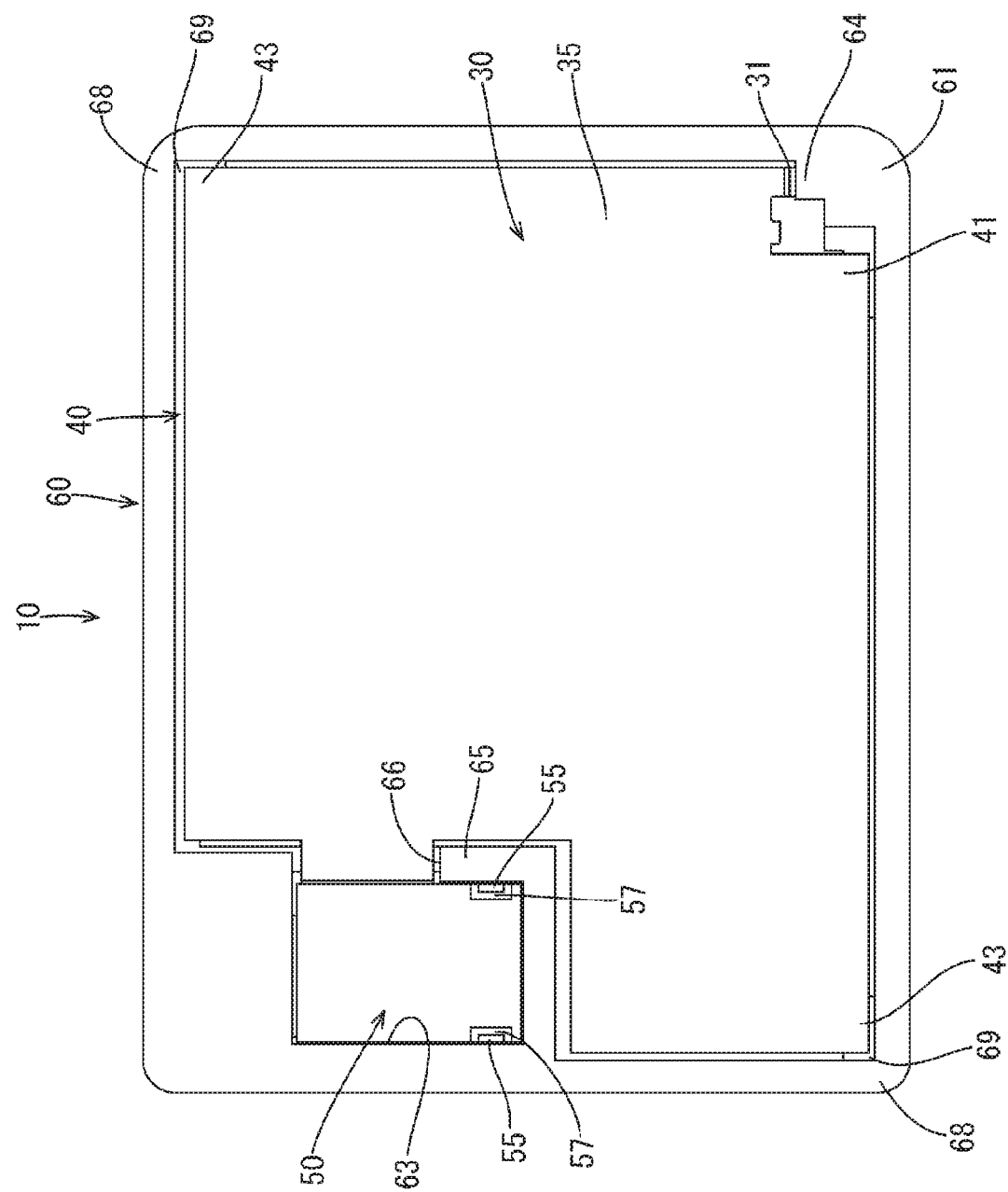
FIG. 16 is a bottom view illustrating a state in which the circuit assembly is installed to the frame, and thereafter the terminal block is assembled thereto.

An insertion groove 66 for inserting the second bus bar 32 is formed in a side wall 65 of the installation portion 63 of the frame 60. The insertion groove 66 has such a shape that an inner space of the installation portion 63 and an inner space of the housing portion 67 are in communication with each other, and the second bus bar 32 can be inserted from the housing portion 67 side to the installation portion 63 side. The second bus bar 32 that is inserted through the insertion groove 66 and provided in the housing portion 67 faces downward, as shown in FIG. 15, and is received by the fastening seat surface 53 by installing the terminal block 50 to the installation portion 63 from below, as shown in FIG. 2. Accordingly, the other end side 42 of the circuit assembly 40 is supported by the terminal block 50 provided on the other end side 62 of the frame 60.

A pair of auxiliary receiving portions 69 are formed in a pair of diagonal portions 68 of four corner portions of the frame 60 other than the one end side 61 and the other end side 62. A pair of diagonal portions 43 of four corner portions of the circuit assembly 40 other than the one end side 41 and the other end side 42 come into contact with the auxiliary receiving portion 69 from below, as shown in FIG. 14. That is, the first bus bar 31 comes into contact with the receiving portion 64 of the frame 60 from above, and the second bus bar 32 comes into contact with the fastening seat surface 53 of the terminal block 50 from above. In contrast, the pair of diagonal portions 43 of the circuit assembly 40 differ in that the pair of diagonal portions 43 come into contact with the pair of the auxiliary receiving portions 69 from below. Accordingly, rotation of the circuit assembly 40 about an axis that passes through the first bus bar 31 and the second bus bar 32 can be suppressed. Note that the conductive plate 30 is exposed in the pair of diagonal portions 43 of the circuit assembly 40, and the auxiliary receiving portions 69 are to come into contact with the exposed conductive plate 30.

Figure 4:
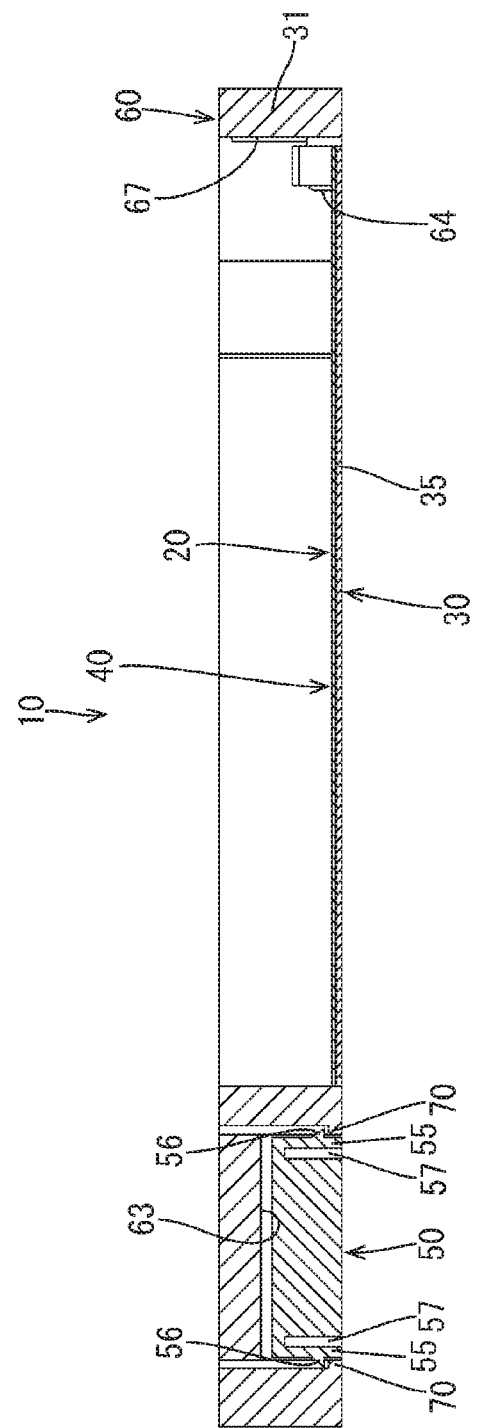
FIG. 4 is a cross-sectional view taken along line C-C in FIG. 1.

A pair of engaging step portions 70 to which the pair of engaging pieces 55 of the terminal block 50 are to be engaged are formed in an inner wall of the installation portion 63, as shown in FIG. 4. The engaging step portions 70 are located on a lower end side of the installation portion 63. When the terminal block 50 is installed to the installation portion 63 from below, the engaging protrusions 56 of the engaging pieces 55 are respectively pushed by the inner wall of the installation portion 63, and the engaging pieces 55 enter the respective bending spaces 57. When the terminal block 50 is properly installed to the installation portion 63, the engaging protrusions 56 are respectively fitted into the engaging step portions 70, and the engaging pieces 55 are elastically restored. Accordingly, the engaging protrusions 56 are hooked from above and engaged to the respective engaging step portions 70, and the terminal block 50 is held in the installation portion 63.

The present embodiment is configured as described above, and operation thereof will be subsequently described. First, the circuit assembly 40 shown in FIG. 8 is formed by adhering the circuit board 20 and the conductive plate 30 to each other. The first bus bar 31 is caused to be supported by the receiving portion 64, while inserting the second bus bar 32 of the circuit assembly 40 into the insertion groove 66 of the frame 60. Because the second bus bar 32 is not supported by the terminal block 50 in this state, the circuit assembly 40 may be assembled in a state in which the frame 60 is inverted vertically, as shown in FIG. 15. In this way, the pair of diagonal portions 43 of the circuit assembly 40 are supported by the pair of auxiliary receiving portions 69 of the frame 60, and therefore an operation for assembling the circuit assembly 40 to the frame 60 can be facilitated.

Next, the terminal block 50 is assembled to the installation portion 63 of the frame 60. Thus, the pair of engaging protrusions 56 of the terminal block 50 are engaged to the pair of engaging step portions 70 of the installation portion 63, and as a result the terminal block 50 is held at the installation portion 63. Thereafter, when the frame 60 is inverted vertically, a state is realized in which the first bus bar 31 is supported by the receiving portion 64 of the frame 60, and the second bus bar 32 is supported by the fastening seat surface 53 of the terminal block 50. Therefore, the circuit assembly 40 is held by the frame 60. Even in a case where the circuit assembly 40 is likely to be deformed because the circuit board 20 has a thin plate shape and a slit (not shown) is formed in the conductive plate 30, for example, deformation of the circuit assembly 40 can be suppressed by the frame 60. Accordingly, handling of the circuit assembly 40 can be facilitated.

Also, because the frame 60 can be used as is as a jig that is used when an electronic component is mounted on the circuit board 20, a conventionally used jig for mounting is no longer required. In this way, a soldering paste is applied on the circuit board 20 of the circuit assembly 40 that is held by the frame 60, an electronic component is mounted on a predetermined position on the circuit board 20, reflow soldering or the like is performed, and thus the electronic component is mounted on the circuit board 20. Thereafter, by installing a cover in an upper opening portion of the frame 60 or the like, the electrical junction box is configured. Then, a round terminal (not shown) that is connected to a power supply is placed on an upper surface of the second bus bar 32, and as a bolt is screwed into the screw hole 54, the terminal block 50 and the second bus bar 32 are pulled toward the round terminal side and are lifted up. As a result, a state is realized in which the second bus bar 32 is interposed between the upper surface 58 of the terminal block 50 and an inner wall upper surface 71 of the installation portion 63, as shown in FIG. 2, and the circuit assembly 40 is held by the frame 60 without rattling in a vertical direction.

In the present embodiment as described above, the circuit assembly 40 can be held by the frame 60, which is an essential constituent component of the electrical junction box 10, even in a case where the circuit board 20 is likely to be deformed because of the thin plate shape thereof, and therefore the deformation of the circuit board 20 can be suppressed, and handling of the circuit board 20 can be facilitated. Also, when an electronic component is mounted on the circuit board 20, the frame 60 can be used as a jig for holding the circuit assembly 40, and therefore a separate jig for holding the circuit assembly 40 is not necessary.

A first engaging portion and a second engaging portion may be bus bars (first bus bar 31 and second bus bar 32) that are formed in the conductive plate 30.

With this configuration, the first engaging portion and the second engaging portion can be formed by using the bus bars.

A engaging component may be the terminal block 50 that includes the housing 51 made of resin and the nut 52 embedded in the housing 51.

With this configuration, the other end side 42 of the circuit assembly 40 can be received using the terminal block 50.

A second engaged portion may be the seat surface (fastening seat surface 53) of the nut 52 that receives the second engaging portion (second bus bar 32).

With this configuration, the seat surface (fastening seat surface 53) of the nut 52 to which the second engaging portion (second bus bar 32) configured by the bus bar is bolted can be the second engaged portion.

Other Embodiments

The techniques disclosed in the specification are not limited to the embodiment described by way of the above descriptions and figures, and various modes such as the following, for example, are also encompassed.

(1) Although the first bus bar 31 and the second bus bar 32 each have a stepped shape in the above embodiment, the first bus bar 31 and the second bus bar 32 may have a flat plate shape.

(2) Although the first engaging portion and the second engaging portion are formed in the conductive plate 30 in the above embodiment, the first engaging portion and the second engaging portion may be formed in the circuit board.

(3) Although the terminal block 50 is given as an example of the engaging component in the above embodiment, the engaging component may be configured by only a housing made of resin. In this case, the second engaged portion is the upper surface of the housing. Also, a engaging component such as a metal component whose surface is coated with resin can be applied as another example of the engaging component. In short, it is sufficient that the engaging component is separate from the frame 60, and is configured such that the second bus bar 32 is interposed and fixed between the frame 60 and the engaging component. The material of the engaging component is not specifically limited.

(4) Although a heat radiation member is not used in the above embodiment, a heat radiation member may be attached to a lower surface of the conductive plate 30.

The invention claimed is:
1. An electrical junction box comprising:
a circuit assembly including a circuit board and a conductive plate;
an engaging component: and
a frame including an installation portion to which the engaging component is installed,
wherein a first engaging portion is formed on one end side of the circuit assembly, the first engaging portion being displaced from the conductive plate and having a first mounted surface disposed on a plane parallel to the conductive plate, and a second engaging portion is formed on another end side of the circuit assembly, the second engaging portion being displaced from the conductive plate and having a second mounted surface disposed on a plane parallel to the conductive plate,
the frame includes a first engaged portion having a first seat surface which is planar and that is engaged with the first engaging portion and receives the one end side of the circuit assembly, and
the engaging component includes a second engaged portion having a second seat surface which is planar and that is engaged with the second engaging portion and receives the other end side of the circuit assembly.
2. The electrical junction box according to claim 1, wherein the first engaging portion and the second engaging portion are bus bars formed in the conductive plate.

3. The electrical junction box according to claim 2, wherein the engaging component is a terminal block that includes a housing made of resin and a nut embedded in the housing.

4. The electrical junction box according to claim 3, wherein the second seat surface is disposed on the nut that receives the second engaging portion.

5. The electrical junction box according to claim 1, wherein the engaging component is a terminal block that includes a housing made of resin and a nut embedded in the housing.

6. The electrical junction box according to claim 5, wherein the second seat surface is disposed on the nut that receives the second engaging portion.

* * * * *